United States Patent [19]

Nishizawa et al.

[11] Patent Number: 4,525,742
[45] Date of Patent: Jun. 25, 1985

[54] TWO-DIMENSIONAL SOLID-STATE IMAGE SENSOR DEVICE

[75] Inventors: Junichi Nishizawa; Takashige Tamamushi, both of Sendai; Fumihiko Ando; Shigeo Yoshikawa, both of Tokyo; Koji Shimanuki, Kanagawa, all of Japan

[73] Assignee: Fuji Photo Film Co. Ltd., Minamiashigara, Japan

[21] Appl. No.: 579,643

[22] Filed: Feb. 13, 1984

[30] Foreign Application Priority Data

Feb. 14, 1983 [JP] Japan .................................. 58-21688

[51] Int. Cl.$^3$ .............................................. H01N 3/12
[52] U.S. Cl. .................................... 358/213; 358/212; 358/209; 357/24
[58] Field of Search ................. 358/209, 212, 213, 41; 357/22, 30, 24 LR; 250/578

[56] References Cited

U.S. PATENT DOCUMENTS

| 4,189,749 | 2/1980 | Hiroshima et al. | 358/167 |
| 4,233,632 | 11/1980 | Akiyama | 358/212 |
| 4,317,127 | 2/1982 | Nishizawa | 357/42 |
| 4,453,184 | 6/1984 | Hamakawa et al. | 358/213 |
| 4,454,526 | 6/1984 | Nishizawa et al. | 357/30 |
| 4,462,047 | 7/1984 | Fujimoto et al. | 358/212 |

Primary Examiner—Gene Z. Rubinson
Assistant Examiner—Robert Lev
Attorney, Agent, or Firm—Cushman, Darby & Cushman

[57] ABSTRACT

A two-dimensional solid-state image sensor device comprising a plurality of picture cells two-dimensionally arranged in column and row directions. Each cell has a static induction transistor having drain and source regions disposed on opposite sides of a high resistance semiconductor channel region, and a gate region adjacent to the channel region to control a current flowing between the drain and source regions, and a transparent electrode disposed via a capacitance on at least a portion of the gate region, in a manner that light is incident through the transparent electrode to the gate region in which the charge produced by the light excitation is stored to control the current. Selection lines connected to the gate regions in each column in common via the capacitances are sequentially selected. A readout pulse voltage is applied to the selected selection line during one horizontal scanning period and a refresh pulse voltage larger than the readout pulse voltage is applied to the selected selection line during one horizontal blanking period subsequent to the horizontal scanning period. Each picture cell is selected in the column and row directions so that a signal is read out therefrom.

4 Claims, 10 Drawing Figures

FIG_6

TWO-DIMENSIONAL SOLID-STATE IMAGE SENSOR DEVICE

BACKGROUND OF THE INVENTION

1. Field of the Invention

The present invention relates generally to a two-dimensional solid-state image sensor device and more particularly to a two-dimensional solid-state image sensor device of the type in which each picture cell consists of a static induction transistor which functions as photodetector and switching element and in which a plurality of such picture cells are two-dimensionally arranged in a mosaic array.

2. Description of the Prior Art

In a conventional solid-state image sensor device, each picture cell comprises a diode for sensing a light image and a switching transistor. That is, a light image is detected by the diode and the sensed signal per se is outputted as a video signal. As a result, the conventional solid-state image sensor device has disadvantages in that the signal output is small and its sensitivity is low. Thus, the degree of integration of the conventional image sensor is limited in terms of sensitivity.

The applicant has disclosed, in Japanese Patent Application No. 204656/1981, a solid-state image sensor device of the type in which a static induction transistor with a high light sensitivity is used so that a light signal is stored in its gate region and a video signal is derived by controlling the current flowing between the source and the drain in response to the potential at the gate region, whereby a high signal output is obtained.

FIGS. 1 and 2 show sectional views of embodiments of a picture cell used in the above-described solid-state image sensor device. In FIG. 1, reference numeral 1 designates a silicon n+ substrate; 2, and n− (or intrinsic) semiconductor region which has a high resistance and serves as a channel; 3, an n+ drain region which has a high concentration and serves as drain region; 4, a p+ region which has a high impurity concentration and is formed so as not to interrupt the channel region and serves as a gate; 4-1 and 4-2, p+ regions in FIG. 2 which have a high impurity concentration and are formed so as not to interrupt the channel region and serve as a control gate and a shielding gate, respectively; and 6, an insulation layer or film such as an SiO₂ or Si₃N₄ film for providing a capacitor over the gate region 4 (FIG. 1) or over the control gate region 4-1 (FIG. 2). 7, 8 and 10 denote gate, drain and source electrodes, respectively. At least the gate electrode 7 is transparent to an incident light 18. 9 denotes a surface protection layer or film such as SiO₂.

Reference numeral 11 designates a switching transistor; $\phi_S$, a control signal applied thereto; 13, a selection line for applying a read pulse voltage $\phi_G$ to the gate electrode 7 from a picture cell selection circuit (not shown); 14, a load resistor; 15, a video voltage supply; 16, a signal readout line; 17, an output terminal; and 18, a light input.

The picture cell as shown in FIG. 2 is different from that as shown in FIG. 1 in that the former has the two gate regions 4-1 and 4-2. Of the two gate regions 4-1 and 4-2, the p+ region 4-1 is the control gate which controls the current flow between the source and the drain in accordance with the storage of charge induced in response to the light input. The control gate 4-1 together with the insulating layer or film 6 and the electrode 7 constitute a capacitor. Another p+ region 4-2 is the shielding gate and surrounds the control gate 4-1 and the n+ drain region 3. The control gate 4-1 and the shielding gate 4-2 produce a potential barrier in the channel.

While FIG. 1 shows the structure of only one picture cell, it should be noted that when many picture cells are formed, the shielding gate 4-2 serves to isolate one picture cell from others by a depletion layer. A potential may be applied to the shielding gate 4-2. Alternatively, the shielding gate 4-2 may be grounded through a resistor.

FIG. 3 shows an equivalent circuit of the picture cell shown in FIG. 1 or 2 and the operation of the picture cell will be explained with reference to FIG. 3.

When the input light 18 is incident to the picture cell, the light excited holes are stored in the gate region 4 or 4-1 so that the light signal is written therein.

Next, when the pulse voltage $\phi_S$ is applied to the base (or gate) of the transistor 11, the voltage at the power supply 15 is applied across the source and the drain of the static induction transistor 100 as shown in FIG. 1 and if the pulse voltage $\phi_G$ is further applied to the gate region 4 so that the static induction transistor 100 becomes conductive, the drain current corresponding to the light input 18 is derived from the output terminal 17. The output signal derived from the output terminal 17 varies depending upon the intensity of the light input 18. The amplification factor of the static induction transistor 100 is more than $10^3$ which is higher at least by one order than a conventional bipolar transistor. Furthermore, the dynamic range of the output signal is large. The capacitor which is connected to the gate is provided in order to block the direct current and to store the light signal.

While the picture cell per se of the solid-state image sensor device of the type described above has various advantageous properties as described above, the inventors have found that a novel readout process is required when a plurality of picture cells of the type described above are two-dimensionally arranged to form a two-dimensional solid-state image sensor device.

The reasons follow in detail. When a television signal is obtained from the two-dimensional solid-state image sensor device, the storage and readout of the video signal must be repeatedly carried out per field or frame unit. It follows, therefore, that the video signal is required to be stored in each cell after the readout of the video signal from one picture cell or from each of the picture cells arranged in one horizontal line (corresponding to one horizontal scanning) is completed and before the readout of the video signal from the same one picture cell or from each of the same picture cells arranged in the same one horizontal line during the next field or frame. Therefore, immediately after the readout from one picture cell or from each of the picture cells arranged in one horizontal line is completed, it is necessary that the same picture cell is refreshed (cleared) and the storage of a new video signal starts.

In a conventional two-dimensional solid-state image sensor device the type in which photodiodes and MOS transistor are combined, carriers corresponding to the intensity of light incident to the photodiode are supplied to the source junction of the MOS transistor, while the MOS transistor is interrupted, thereby rendering the MOS transistor conductive. Simultaneously, a transistor which is connected to the drain of the MOS transistor is rendered conductive so that a charge current flows from the drain to the source. An output signal is obtained depending upon an amount of the charge current. Therefore, the readout process of one picture cell corresponds to the refreshment of that picture cell. Thus, a video signal can be obtained by rendering both the pulses $\phi_G$ or $\phi_s$ ON precedingly; i.e., the pulse $\phi_G$ to be applied to the gate of the MOS transistor or the pulse $\phi_s$ to be applied to the gate of a transistor connected between the drain of the MOS transistor and a terminal of a video power supply (serving also as an output terminal).

On the other hand, in the above-described solid-state image sensor device of the type in which the light signal is stored in the gate region of the static induction transistor and the video signal is derived therefrom by controlling the current flowing between the source and the drain in response to the potential of the gate region, it is impossible to store a new video signal unless the video signal stored in the gate region is refreshed immediately after the video signal is readout. As a result, the video signal cannot be obtained.

With this in view, the image sensor device of this type employs the circuit arrangement as shown in FIG. 4 in which a vertical scanning circuit 20 is used to sequentially select read lines 11-1, 11-2, . . . , and 16-L while a horizontal scanning circuit 21 is used to sequentially select lines 13-1, 13-2, . . . , and 13-K. As illustrated in FIG. 5, in response to the pulse $\phi_{s1}$, the read line 16-1 is selected and during the period of this pulse $\phi_{s1}$, the pulses $\phi_{G1}$, $\phi_{G2}$, . . . , and $\phi_{GK}$ are sequentially selected. The video signal in the picture cells (1-1), (2-1), . . . , and (K-1) which are connected to the read line 16-1 are read out. Thereafter in response to the next pulse $\phi_{s2}$, the read line 16-2 is selected and during the period of this pulse $\phi_{s2}$, the pulses $\phi_{G1}$, $\phi_{G2}$, . . . , and $\phi_{GK}$ are sequentially selected. When the pulses $\phi_{s3}$, $\phi_{s4}$, . . . , and $\phi_{sL}$ are sequentially selected in this manner, the light signals stored in the respective gate regions 4 or 4-1 of the picture cells (1-1), (2-1), . . . , and (K-1) which are connected to the read line 16-1, of which the read out selection is completed, will not be refreshed at all. Therefore, in order to refresh the gate regions 4 or 4-1 of these picture cells (1-1), (2-1), . . . , and (K-1) which are connected to the read line 16-1, it may be proposed to increase the voltage level of the gate pulses, $\phi_{G1}$, $\phi_{G2}$, . . . , and $\phi_{GK}$ so that the light signals stored in the gate regions 4 or 4-1 are discharged. In this case, however, all the light signals stored in the picture cells connected in common to the selection line 13-1, 13-2, . . . , and 13-K are also discharged, so that it is impossible to attain the two-dimensional image readout.

SUMMARY OF THE INVENTION

One of the objects of the present invention is therefore to provide a one-cell-with-one-transistor type two-dimensional solid-state image sensor device in which the above disadvantages are removed in such a way that one static induction transistor with a high degree of light sensitivity is used both for the detection of the light image and for switching.

Another object of the present invention is to provide a two-dimensional solid-state image sensor device of the type described above which is also adapted to obtain a video signal.

In the present invention, therefore, there is provided a two-dimensional solid-state image sensor device which comprises a plurality of picture cells which are two-dimensionalally arranged in column and row directions. Each picture cell comprises a static induction transistor having first and second main electrode regions formed of semiconductor regions with one conductivity type which are disposed on opposite sides of a high resistance semiconductor channel region, and a gate region formed of a semiconductor region with the other conductivity type which is adjacent to the channel region to control a current flowing between the first and second main electrode regions, and a transparent electrode disposed via a capacitance on at least a portion of the gate region, in a manner that light is incident through the transparent electrode to the gate region in which the carrier produced by the light excitation is stored to control the current. Each of a plurality of selection lines connects the gate regions of the picture cells in each column in common via the capacitances. There are provided means for sequentially selecting the plurality of selection lines and means for applying a readout pulse voltage to the plurality of selection lines during one horizontal scanning period and for applying a refresh pulse voltage which is larger than the readout pulse voltage during one horizontal blanking period. Each of a plurality of signal readout lines connects the first main electrode regions of the picture cells in each row in common. There are also provided means for sequentially selecting the plurality of signal readout lines during one horizontal scanning period and means for applying a readout pulse to the first main electrode regions to obtain a video signal stored in the picture cell selected by the selected selection line.

Here, an insulation layer is preferably disposed between the gate region and the transparent electrode to form the capacitance.

It is preferable that one of the main electrode region is disposed opposite to one side of the gate region.

It is preferable that the refresh pulse voltage is higher at least five times than the readout pulse voltage.

The above and other objects, effects, features and advantages of the present invention will become more apparent from the following description of the preferred embodiments thereof taken in conjunction with the accompanying drawings.

DETAILED DESCRIPTION OF THE PREFERRED EMBODIMENTS

Figure 1:
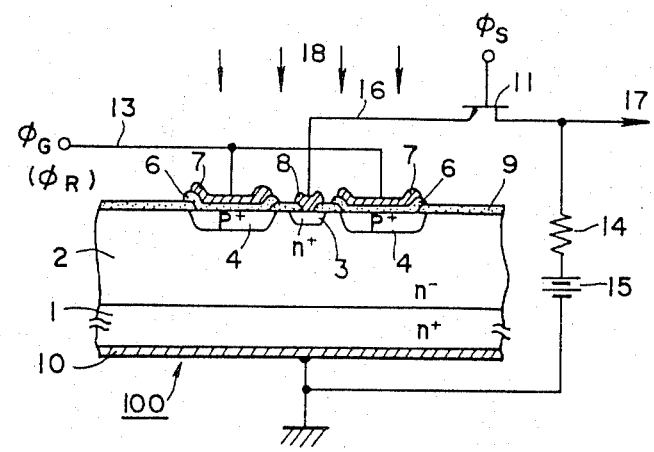
FIGS. 1 and 2 are cross sectional views showing two embodiments of a picture cell used in a two-dimensional solid-state image sensor device.
Figure 3:
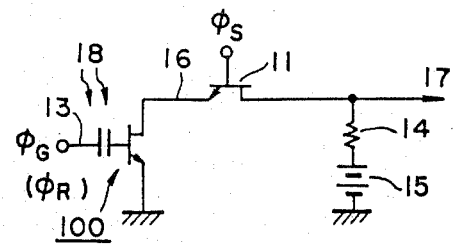
FIG. 3 is a circuit diagram showing an equivalent circuit thereof.

Same reference numerals are used to designate similar or corresponding parts throughout the figures.

Figure 6:
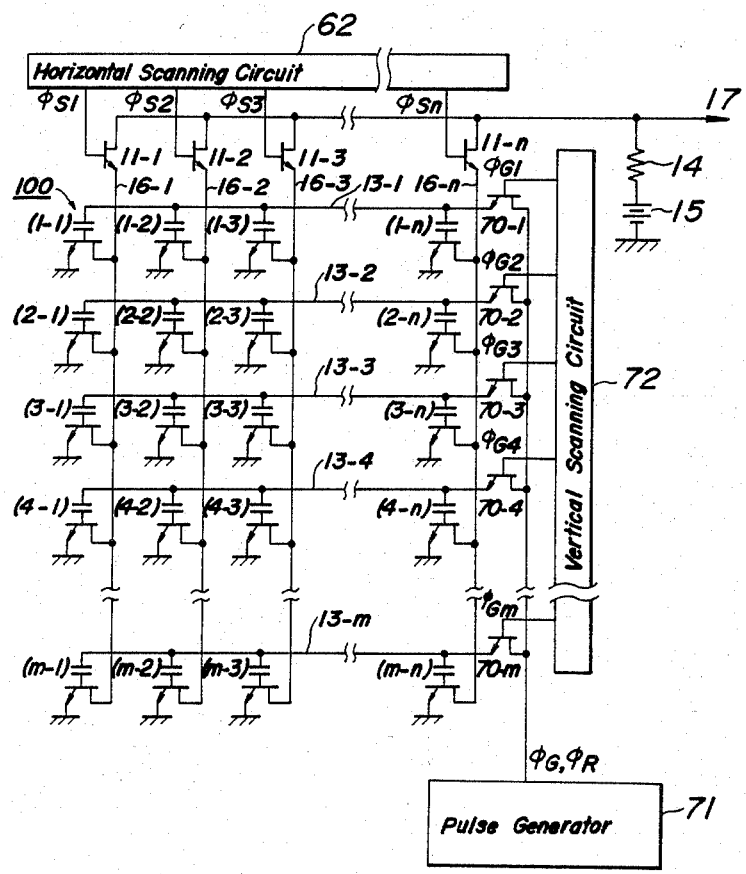
FIG. 6 is a circuit diagram showing an embodiment of a two-dimensional solid-state image sensor device in accordance with the present invention.
Figure 8:
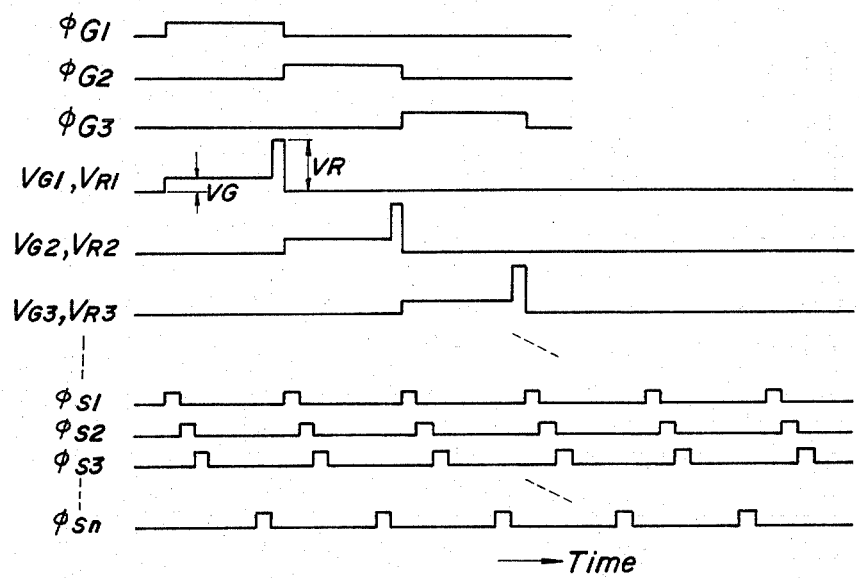
FIG. 8 is a timing chart used to explain the operations thereof.

FIG. 6 shows a circuit diagram of an embodiment of a two-dimensional image sensor in accordance with the present invention and FIG. 8 shows a timing chart used to explain the operations thereof.

Figure 7:
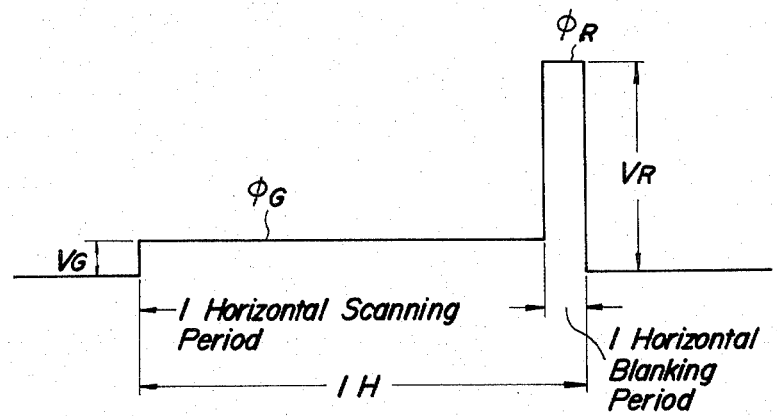
FIG. 7 is an illustration of an example of waveform applied to the picture cells shown in FIG. 6.

Referring first to FIG. 6, signal readout lines 16-1, 16-2, ..., and 16-n are connected through switching transistors 11-1, 11-2, ..., and 11-n to an output terminal 17, respectively. These switching transistors 11-1, 11-2, ..., and 11-n are selected sequentially in response to pulses $\phi_{s1}$, $\phi_{s2}$, ..., and $\phi_{sn}$ from a horizontal scanning circuit 62, so that the signal readout lines 16-1, 16-2, ..., and 16-n are sequentially selected. Consequently, a video voltage is applied to the drain regions of the respective picture cells 100 of the selected row. The selection lines 13-1, 13-2, ..., and 13-m are connected, respectively, through switching transistors 70-1, 70-2, ..., and 70-m to a pulse generator 71. The pulse generator 71 produces a pulse having a first portion of a relatively low voltage $V_G$ during a horizontal scanning period and a second portion of a relatively high voltage $V_R$ during a horizontal blanking period at every one horizontal period (1H) as shown in FIG. 7. At every horizontal period, a readout pulse $\phi_{G1}$, $\phi_{G2}$, ..., $\phi_{Gm}$ are applied to the gates of the switching transistors 70-1, 70-2, ..., 70-m, from a vertical scanning circuit 72 respectively.

In this manner, for instance, as shown in FIG. 8, in response to the pulse $\phi_{G1}$, the selection line 13-1 is selected. During this horizontal period during which the readout pulse voltage $V_{G1}$ is applied, read pulses $\phi_{s1}$, $\phi_{s2}$, ..., and $\phi_{sn}$ are sequentially derived from the horizontal scanning circuit 62 and applied to the gates of the switching transistors 11-1, 11-2, ..., 11-n, respectively. During one horizontal blanking period immediately after the video signals are read out from the picture cells (1-1), (1-2), ..., and (1-n), the refresh pulse voltage $V_{R1}$ is applied to the switching transistor 70-1 so that the gate regions of the picture cells (1-1), (1-2), ..., (1-n) are refreshed.

In this way, the signals stored in the respective picture cells (2-1), (2-2), ..., (2-n); (3-1), (3-2), ..., (3-n); ...; (m-1), (m-2), ..., (m-n), which are connected to the selection lines 13-2, 13-3, ..., 13-m, are read out so as to form a one-field or one-frame video signal.

Further, an interlace scanning and readout may be employed so that the solid-state image sensor device of the present invention is well adapted to NTSC system.

Here, it is required that the refresh pulse voltage $V_R$ to be applied to the selection lines be made sufficiently greater than the readout voltage $V_G$ in order to refresh the picture cell. For instance, it is preferable that $V_R \geq 5 \times V_G$.

While in FIG. 8 the pulse voltages $V_{G1}$, $V_{G2}$, $V_{G3}$, ... and $V_{R1}$, $V_{R2}$, $V_{R3}$, ... are illustrated in the form of mutually isolated pulses, these pulse forms may be combined to form consecutive pulses in which the voltages $V_G$ and $V_R$ are repeatedly produced at every horizontal scanning period.

Figure 2:
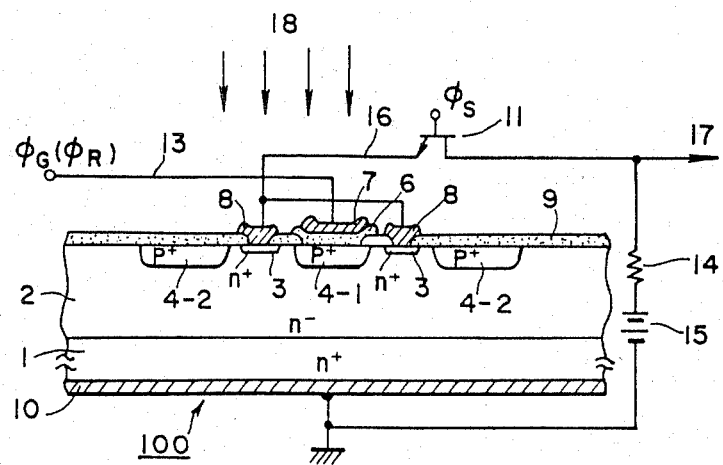
Figure 4:
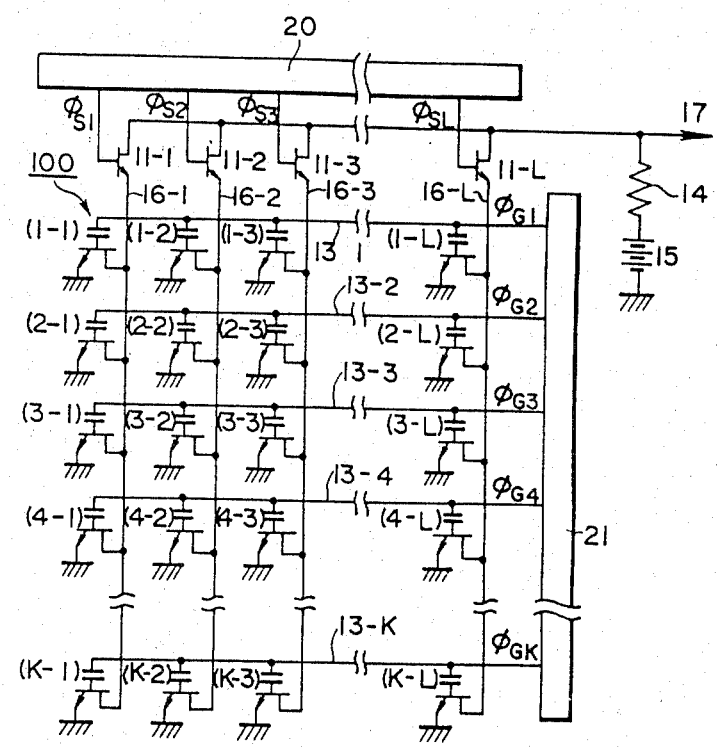
FIG. 4 is a circuit diagram showing a two-dimensional solid-state image sensor device in which the picture cells as shown in FIG. 1 or 2 are incorporated.
Figure 5:
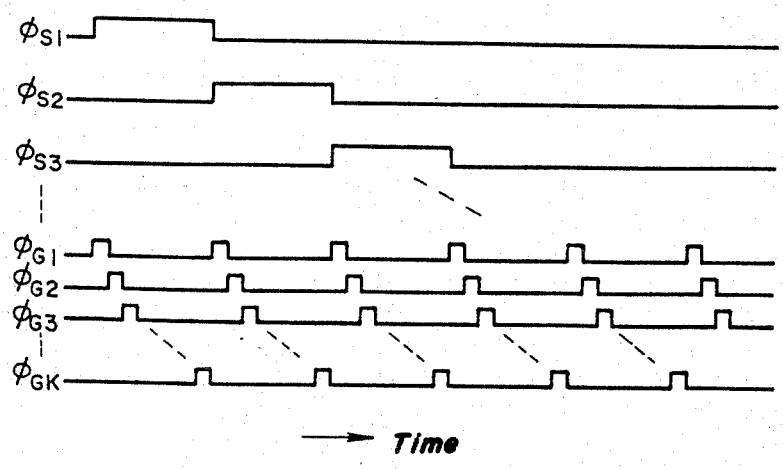
FIG. 5 is a timing chart used to explain the operations thereof.

As the picture cells to be used in the solid-state image sensor in accordance with the present invention, the picture cell of the type as shown in FIG. 1 or 2 can be used as it is.

In order to provide a static induction transistor as the picture cell, the impurity concentration in the $n^-$ channel region 2 must be substantially less than $1 \times 10^{16}$ cm$^{-3}$ and the impurity concentration of the gate, source and drain regions must be substantially higher than $1 \times 10^{18}$ cm$^{-3}$. In order that the drain current does not flow even when the gate voltage is 0 V, the sizes and impurity concentrations are so selected that the portion between the gates and the portion between the gate and the channel are depleted only at a diffusion potential.

Furthermore, the present invention can use static induction transistors of the type in which the drain current flows even when the gate voltage is 0 V and the drain current is interrupted when a slightly negative voltage is applied to the gate. It is apparent that the fabrication of the picture cells would become easier when the thickness of the gate is increased and the spacing between the adjacent gates are also reduced.

Since the light amplification is needed, care should be so taken that no crystal dislocation or defect results in each step. For instance, in the case of the boron diffusion of the $p^+$ gate, an atom selected from the group IV is used so as to prevent the lattic distortion. In order to prevent the recombination of the electrons and holes in the $n^-$ channel region, the carrier life in the channel region must be longer. Thus, in the last step, gettering of a heavy metal is carried out so that the carrier life in the channel region is increased.

Figure 9:
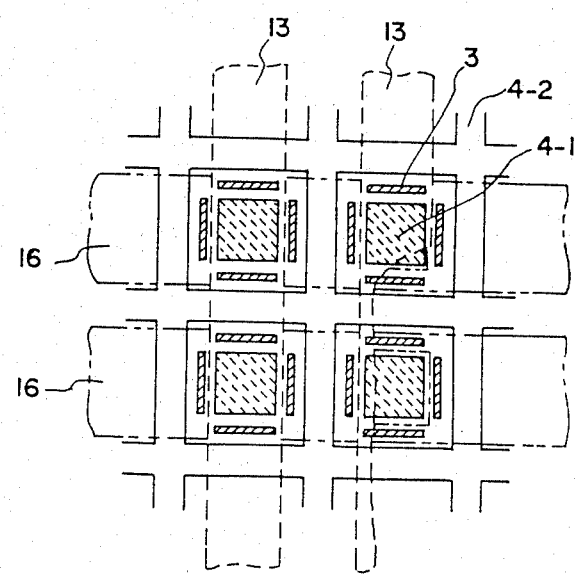
FIG. 9 is a partial top view showing an embodiment of a two-dimensional solid-state image sensor device in accordance with the present invention.

In order to provide a two-dimensional solid-state image sensor device with a higher degree of density. It is preferable to use the picture cell of separated gate type as shown in FIG. 2 of the picture cells as shown in FIGS. 1 and 2, since better isolation between the adjacent picture cells can be ensured by means of the control gate 4-1 and the shielding gate 4-2. FIG. 9 is a plan view showing the arrangement of the picture cells as shown in FIG. 2 together with their electrodes. The shielding gate regions 4-2 surround the control gate region 4-1 and the drain region (drain electrode) 3. The shielding gate regions 4-2 are formed in common for all picture cells. Reference numeral 16 designates a readout line. The hatched portion of the readout line 16 is made into electrical contact with the drain region 3 while the non-hatched portion is electrically isolated. The readout line 16 has a window which is so formed as to uncover the control gate region 4-1. Reference numeral 13 designates a selection line. The selection line 13 and the control gate region 4-1 form a capacitor at the hatched portion. It is required that the electrode 7 is transparent to light.

Figure 10:
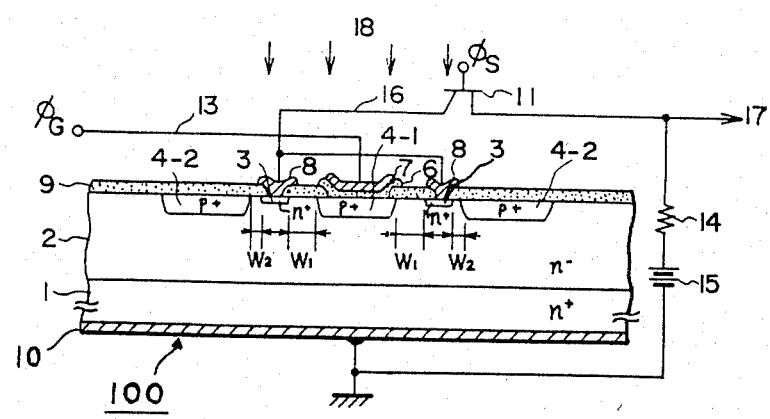
FIG. 10 is a sectional view showing another embodiment of a picture cell used in a two-dimensional image sensor device in accordance with the present invention.

FIG. 10 shows a further modification of a picture cell to be used in a solid-state image sensor device in accordance with the present invention. The distance $W_2$ between the drain region 3 and the shielding gate region 4-2 is considerably smaller than the distance $W_1$ between the drain region 3 and the control gate region 4-1. That is, $W_1 > W_2$. The depletion layer from the control gate region 4-1 is further broadened so that the charge produced by the excitation of light can efficiently be stored in the control gate region 4-1.

In the above-described embodiments, the position of the drain region 3 may be replaced with the position of the source region 1 and a voltage may be applied through the load resistor 14 to the $n^+$ region 1 from the power supply 15. Furthermore, the conductivity type of each region can be reversed. In this case, instead that the positive pulse voltages $V_G$ and $V_R$ are applied to the readout lins 13 in the above embodiments, the negative pulse voltages are applied to the readout lines 13. In like manner, the polarity of the video power supply is reversed. Accordingly, instead of holes, electrons are stored in the gate region.

As described above, according to the present invention, the selection lines are sequentially selected during each horizontal scanning period so that the video signals are readout from the respective picture cells, and during each horizontal blanking period the picture cells connected to the selected selection line are refreshed. Thus, the present invention can provides a two-dimensional solid-state image sensor device is preferably used to obtain a television signal.

What is claimed is:

1. A two-dimensional solid-state image sensor device, comprising:
   (a) a plurality of picture cells which are two-dimensionalally arranged in column and row directions; each picture cell comprising:
   (a-1) a static induction transistor having first and second main electrode regions formed of semiconductor regions with one conductivity type which are disposed on opposite sides of a high resistance semiconductor channel region, and a gate region formed of a semiconductor region with the other conductivity type which is adjacent to said channel region to control a current flowing between said first and second main electrode regions, and
   (a-2) a transparent electrode disposed via a capacitance on at least a portion of said gate region, in a manner that light is incident through said transparent electrode to said gate region in which the carrier produced by the light excitation is stored to control said current;
   (b) a plurality of selection lines, each of which connects the gate regions of said picture cells in each column in common via the capacitances;
   (c) means for sequentially selecting said plurality of selection lines;
   (d) means for applying a readout pulse voltage to the selected selection lines during one horizontal scanning period and for applying a refresh pulse voltage which is larger than said readout pulse voltage during one horizontal blanking period subsequent to said horizontal scanning period;
   (e) a plurality of signal readout lines, each of which connects the first main electrode regions of said picture cells in each row in common;
   (f) means for sequentially selecting said plurality of signal readout lines during one horizontal scanning period; and
   (g) means for applying a readout pulse to said first main electrode regions to obtain a video signal stored in the picture cell selected by the selected selection line.

2. A two-dimensional solid-state image sensor device as claimed in claim 1, wherein an insulation layer is disposed between said gate region and said transparent electrode to form said capacitance.

3. A two-dimensional solid-state image sensor device as claimed in claim 1, wherein one of said main electrode region is disposed in opposite to one side of said gate region.

4. A two-dimensional solid-state image sensor device as claimed in claim 1, wherein said refresh pulse voltage is higher at least five times than said readout pulse voltage.

* * * * *